United States Patent
Yamazaki

(10) Patent No.: US 8,243,186 B2
(45) Date of Patent: Aug. 14, 2012

(54) SOLID-STATE IMAGE PICKUP APPARATUS AND ELECTRONIC APPARATUS

(75) Inventor: Tomohiro Yamazaki, Kanagawa (JP)

(73) Assignee: Sony Corporation (JP)

( * ) Notice: Subject to any disclaimer, the term of this patent is extended or adjusted under 35 U.S.C. 154(b) by 203 days.

(21) Appl. No.: 12/657,810

(22) Filed: Jan. 28, 2010

(65) Prior Publication Data

US 2010/0194965 A1 Aug. 5, 2010

(30) Foreign Application Priority Data

Feb. 4, 2009 (JP) ................ P2009-023222

(51) Int. Cl.
*H04N 5/225* (2006.01)
*H01L 31/0232* (2006.01)

(52) U.S. Cl. ...................... 348/340; 257/436

(58) Field of Classification Search .......... 348/345, 348/340, 294, 335, 344
See application file for complete search history.

(56) References Cited

U.S. PATENT DOCUMENTS

| 7,119,319 B2 * | 10/2006 | Noto et al. | 250/208.1 |
| 7,615,732 B2 * | 11/2009 | Tani | 250/216 |
| 7,768,088 B2 * | 8/2010 | Fukunaga | 257/436 |
| 2006/0115230 A1 * | 6/2006 | Komoguchi et al. | 385/146 |
| 2008/0079031 A1 * | 4/2008 | Tani | 257/225 |

FOREIGN PATENT DOCUMENTS

| JP | 07322271 A | 12/1995 |
| JP | 09163384 A | 6/1997 |
| JP | 2001327465 A | 11/2001 |
| JP | 2007214832 A | 8/2007 |
| JP | 2007306447 A | 11/2007 |
| JP | 2008-210975 A | 9/2008 |

OTHER PUBLICATIONS

Office Action from Japanese Application No. 2009-016831, dated Nov. 30, 2010.
Office Action from Japanese Application No. 2009-016831, dated Sep. 6, 2011.

* cited by examiner

*Primary Examiner* — Tuan Ho
*Assistant Examiner* — Ahmed A Berhan
(74) *Attorney, Agent, or Firm* — Lerner, David, Littenberg, Krumholz & Mentlik, LLP

(57) ABSTRACT

Disclosed is a solid-state image pickup apparatus including a plurality of pixels. The plurality of pixels each including a lens, a photoelectric converter to convert incident light that passes through the lens into an electrical signal, and a waveguide provided between the lens and the photoelectric converter. The waveguide is disposed so that a center of at least a part of the waveguide on a light exit side is shifted from a main light beam that passes a center of the lens in a direction in which an area where an end portion of the waveguide on the light exit side is overlapped with the photoelectric converter is increased.

12 Claims, 15 Drawing Sheets

SOLID-STATE IMAGE PICKUP APPARATUS AND ELECTRONIC APPARATUS

CROSS-REFERENCE TO RELATED APPLICATION

The present application claims priority from Japanese Patent Application No. JP 2009-023222 filed in the Japanese Patent Office on Feb. 4, 2009, the entire content of which is incorporated herein by reference.

BACKGROUND OF THE INVENTION

1. Field of the Invention

The present invention relates to a solid-state image pickup apparatus and an electronic apparatus. In particular, the present invention relates to a solid-state image pickup apparatus having a waveguide structure and an electronic apparatus including the solid-state image pickup apparatus.

2. Description of the Related Art

As a solid-state image pickup apparatus, a so-called surface-incident-type solid-state image pickup apparatus is generally used. The solid-state image pickup apparatus of the surface incident type takes incident light from a surface (front surface) on a wiring layer side of an element formation portion on which a photoelectric converter is formed. The solid-state image pickup apparatus of the surface incident type has a structure in which pixel components such as a wiring layer, a protection film, a color filter, and a micro lens are provided on an area of a photoelectric converter.

Incidentally, in a solid-state image pickup apparatus such as a solid-state image pickup apparatus of the surface incident type, miniaturization of a pixel size (cell size) up to approximately 1 μm inevitably causes a reduction in light amount of image light (incident light) that is focused on a micro lens. In addition, because a wiring layer and the like are intervened between a micro lens and a photoelectric converter, a loss of the light amount is significantly generated in the wiring layer and the like, until light focused on a micro lens reaches a photoelectric converter. As a result, a sensitivity of a pixel is significantly deteriorated.

In view of this, to efficiently guide light to a photoelectric converter, that is, to increase light collection efficiency, there have been proposed various solid-state image pickup apparatuses having a so-called waveguide structure in which a waveguide is provided in a center portion of a pixel, and light is confined in the waveguide, thereby suppressing the loss of the light amount (see, for example, Japanese Patent Application Laid-open No. 2008-210975).

BRIEF SUMMARY OF THE INVENTION

When a pixel size is increasingly miniaturized in a solid-state image pickup apparatus of the surface incident type, a degree of freedom of a layout of a photoelectric converter or a pixel transistor on a substrate is lost. As a result, in a solid-state image pickup apparatus having a waveguide structure, a gravity center of an area of a photoelectric converter is shifted from a center of a waveguide or a micro lens, which causes a loss of a light amount corresponding to such an extent that a part of incident light deviates from the area of a photoelectric converter.

In view of the above-mentioned circumstances, it is desirable to provide a solid-state image pickup apparatus having a waveguide structure that is capable of reducing a loss of a light amount in a path that guides light taken by a micro lens to a photoelectric converter through a waveguide, and provide an electronic apparatus provided with the solid-state image pickup apparatus.

According to an embodiment of the present invention, there is provided a solid-state image pickup apparatus including a plurality of pixels. The plurality of pixels each includes a lens, a photoelectric converter to convert incident light that passes through the lens into an electrical signal, and a waveguide provided between the lens and the photoelectric converter. The waveguide is disposed so that a center of at least a part on a light exit side is shifted from a main light beam that passes a center of the lens in a direction in which an area where an end portion of the waveguide on the light exit side is overlapped with the photoelectric converter is increased.

For example, when the center of the entire waveguide is shifted from the main light beam that passes the center of the lens in the direction in which the area where the waveguide is overlapped with the photoelectric converter is increased, the loss of the light amount generated between the lens and the waveguide is slightly larger than the case where the center of the entire waveguide is coincided with the center of the lens. But, because the area where the waveguide is overlapped with the photoelectric converter is large, light confined in the waveguide is efficiently guided to the light reception surface of the photoelectric converter.

In this case, the loss of the light amount generated between the waveguide and the photoelectric converter is smaller than the loss of the light amount between the waveguide and the photoelectric converter in a case where the gravity center of the area of the photoelectric converter is shifted from the center of the lens or the waveguide. Therefore, by using the structure in which the center of the waveguide is shifted from the main light beam that passes the center of the lens in the direction in which the area where the waveguide is overlapped with the photoelectric converter is increased, the total loss of the light amount in the path (optical path) between the lens and the photoelectric converter can be reduced.

According to the present invention, the loss of the light amount in the path between the lens and the photoelectric converter can be reduced as compared to the case where the gravity center of the area of the photoelectric converter is shifted from the center of the lens or the waveguide.

These and other objects, features and advantages of the present invention will become more apparent in light of the following detailed description of best mode embodiments thereof, as illustrated in the accompanying drawings.

DETAILED DESCRIPTION

Hereinafter, embodiments of the present invention will be described in detail with reference to the drawings. It should be noted that the description will be given in an order of the following items.

1. Solid-state image pickup apparatus to which the present invention is applied (example of CMOS image sensor)
2. First embodiment (example of case where single waveguide is provided)
3. Second embodiment (example of case where multiple waveguides are provided)
4. Modification example
5. Electronic apparatus (example of image pickup apparatus)

1. Solid-State Image Pickup Apparatus to which the Present Invention is Applied (System Structure)

Figure 1:
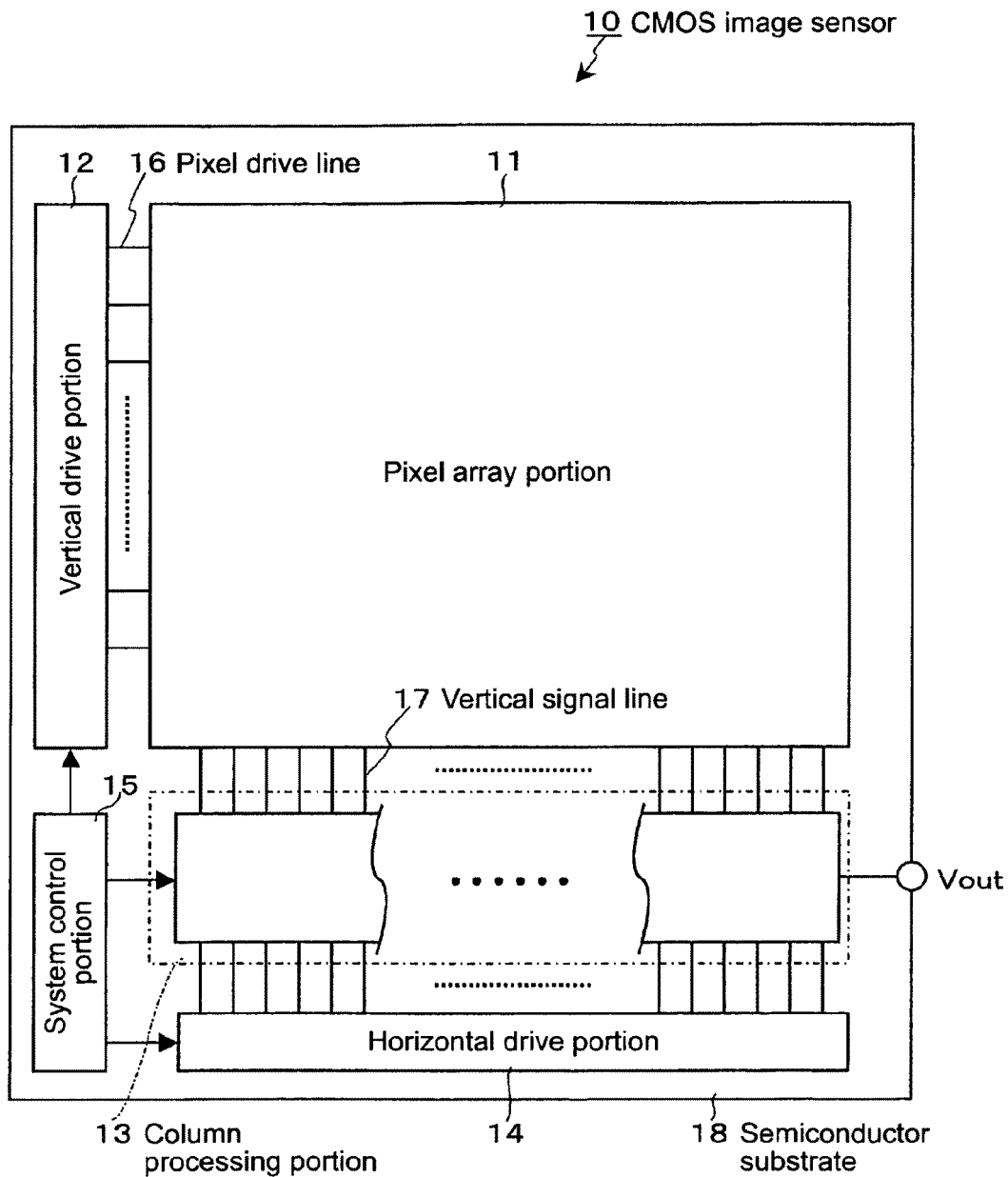
FIG. 1 is a system structural diagram showing a schematic structure of a CMOS image sensor to which the present invention is applied.

FIG. 1 is a system structural diagram showing a schematic structure of a CMOS image sensor as a kind of a solid-state image pickup apparatus to which the present invention is applied, for example, a solid-state image pickup apparatus of an X-Y address type. Here, the CMOS image sensor refers to an image sensor formed by applying or partially using a CMOS process.

As shown in FIG. 1, a CMOS image sensor 10 of this application example includes a pixel array portion 11 formed on a semiconductor substrate (chip) 18 and a peripheral circuit portion integrated on the semiconductor substrate 18 on which the pixel array portion 11 is formed. As the peripheral circuit portion, a vertical drive portion 12, a column processing portion 13, a horizontal drive portion 14, and a system control portion 15 are provided, for example.

In the pixel array portion 11, unit pixels (not shown) (hereinafter, may simply be referred to as "pixel") each including a photoelectric converter (e.g., photodiode) are two-dimensionally arranged in a matrix pattern. The photoelectric converter performs a photoelectric conversion on incident visible light into an amount of charge corresponding to its light amount. Further, to each of the pixels, a lens that collects incident light, i.e., a micro lens (not shown) is provided. In a case of a color display, each of the pixels is provided with a color filter. The specific structure of the unit pixel will be described later.

Further, in the pixel array portion 11, a pixel drive line 16 is formed in a lateral direction of FIG. 1 (pixel row arrangement direction, that is, horizontal direction) for each row of the pixel arrangement in the matrix pattern, and a vertical signal line 17 is formed up and down in FIG. 1 (pixel column arrangement direction, that is, vertical direction) for each column. In FIG. 1, the pixel drive line 16 is shown as a single line, but is not limited to one. One end of the pixel drive line 16 is connected to an output terminal corresponding to each row of the vertical drive portion 12.

The vertical drive portion 12 is formed of a shift register, an address decoder, and the like. Here, the specific structure of the vertical drive portion 12 is not shown. The vertical drive portion 12 has a read scanning system and a reset scanning system. The read scanning system successively performs a selective scanning on the unit pixels that read signals for each row.

On the other hand, the reset scanning system performs a reset scanning in which, with respect to a read-target row that is subjected to the read scanning by the read scanning system, an unnecessary charge is reset from a photoelectric converter of the unit pixel in the read-target row, ahead of the read scanning by a time period corresponding to a shutter speed. By the reset operation of the unnecessary charge by the reset scanning system, a so-called electronic shutter operation is performed. Here, the electronic shutter operation refers to an operation of discharging an optical charge of the photoelectric converter and newly starting exposure (starting to accumulate optical charges).

A signal that is read through a read operation by the read scanning system corresponds to the amount of incident light after the last read operation or the electronic shutter operation. Further, a time period from a read timing of the last read operation or a reset timing by the electronic shutter operation to a read timing by the current read operation corresponds to an accumulation time period of the optical charges (exposure time period) in the unit pixel.

A signal that is output from each of the unit pixels in the pixel row that has been subjected to the selective scanning by the vertical drive portion 12 is supplied to the column processing portion 13 through each of the vertical signal lines 17. For each pixel column of the pixel array portion 11, the column processing portion 13 performs a predetermined signal processing on an analog pixel signal that is output from each of the pixels 20 in the selected row.

As the signal processing performed by the column processing portion 13, a CDS (correlated double sampling) processing can be used, for example. In the CDS processing, a reset level and a signal level that are output from each of the pixels in the selected row are taken, and a difference between those levels is obtained, thereby obtaining a signal for the pixels of one row and removing a fixed pattern noise of each pixel. The column processing portion 13 may have an AD conversion function of digitizing an analog pixel signal.

The horizontal drive portion 14 is constituted of the shift register, the address decoder, and the like, and performs a selective scanning on circuit portions corresponding to the pixel columns of the column processing portion 13 in sequence. Through the selective scanning performed by the horizontal drive portion 14, the pixel signals obtained by performing the signal processing for each pixel column in the column processing portion 13 are output in sequence.

The system control portion 15 receives a clock given from the outside of the semiconductor substrate 18, data for commanding an operation mode, and the like and outputs data such as inside information of the CMOS image sensor 10. Further, the system control portion 15 includes a timing generator that generates various timing signals and performs a drive control on the vertical drive portion 12, the column processing portion 13, the horizontal drive portion 14, and the like based on the various timing signals generated by the timing generator.

(Circuit Structure of Unit Pixel)

Figure 2:
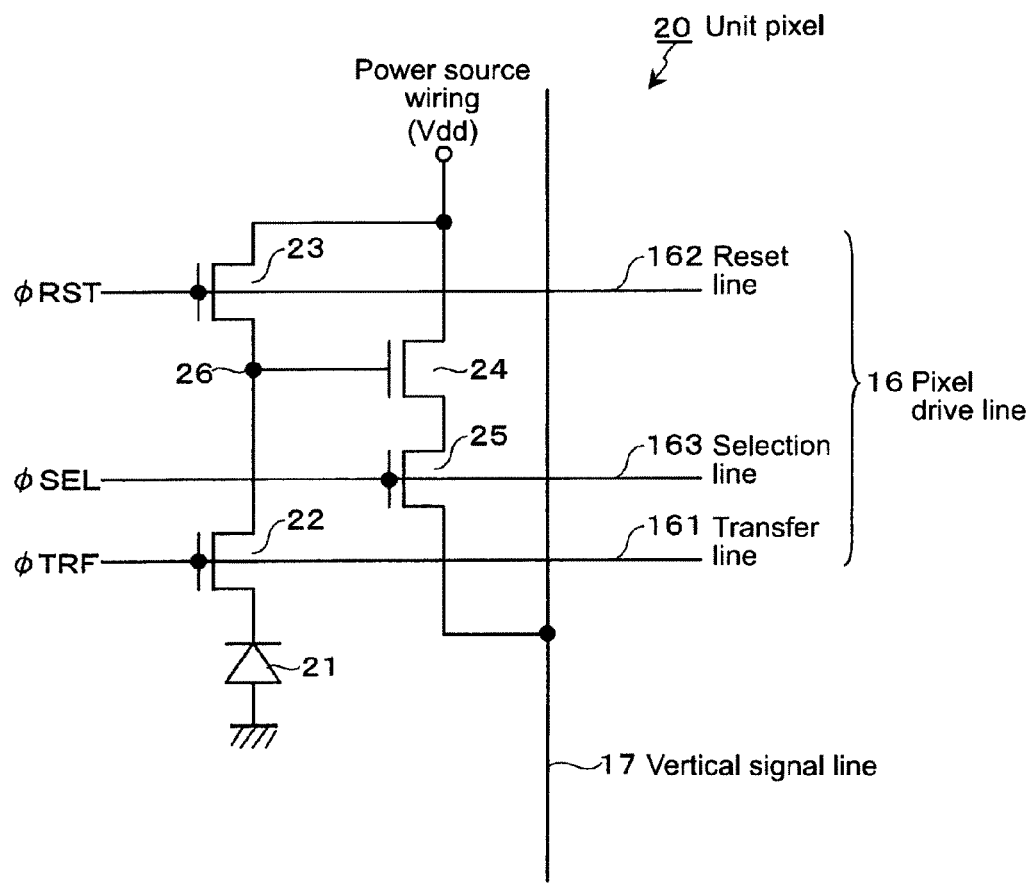
FIG. 2 is a circuit diagram showing an example of a circuit structure of a unit pixel.

FIG. 2 is a circuit diagram showing an example of a circuit structure of the unit pixels 20. As shown in FIG. 2, the unit pixel 20 in this circuit example includes a photodiode 21 that is a photoelectric converter and four transistors of a transfer transistor 22, a reset transistor 23, an amplifier transistor 24, and a selection transistor 25.

In this example, as each of the four transistors 22 to 25, an N-channel MOS transistor is used, for example. But, a combination of conductivity types of the transfer transistor 22, the reset transistor 23, the amplifier transistor 24, and the selection transistor 25 is just an example, and another combination example may be used.

In the unit pixel 20, three drive wirings of a transfer line 161, a reset line 162, and a selection line 163 that serve as the pixel drive line 16 are commonly provided for each of the pixels in the same pixel row. Terminals of the transfer line 161, the reset line 162, and the selection line 163 are connected to output terminals corresponding to the pixel rows of the vertical drive portion 12 for each pixel row.

The photodiode 21 has an anode electrode connected to a negative power source (for example, ground), and performs the photoelectric conversion on light received to an optical charge (in this case, photoelectron) corresponding to its light amount. The photodiode 21 has a cathode electrode that is electrically connected to a gate electrode of the amplifier transistor 24 through the transfer transistor 22. A node that is electrically connected to the gate electrode of the amplifier transistor 24 is referred to as an FD (floating diffusion) portion 26.

The transfer transistor 22 is connected between the cathode electrode of the photodiode 21 and the FD portion 26. To a gate electrode of the transfer transistor 22, a transfer pulse φTRF in which a high level (for example, Vdd level) is an active (hereinafter, referred to as "High active") is transmitted through the transfer line 161. As a result, the transfer transistor 22 becomes an on state and transfers to the FD portion 26 the optical charge that has been subjected to the photoelectric conversion by the photodiode 21.

The reset transistor 23 has a drain electrode connected to a pixel power source Vdd and a source electrode connected to the FD portion 26. To a gate electrode of the reset transistor 23, a High-active reset pulse φRST is transmitted through the reset line 162. As a result, the reset transistor 23 becomes an on state and resets the FD portion 26 by discharging a charge of the FD portion 26 to the pixel power source Vdd prior to the transfer of the signal charge from the photodiode 21 to the FD portion 26.

The amplifier transistor 24 has a gate electrode connected to the FD portion 26 and a drain electrode connected to the pixel power source Vdd. Further, the amplifier transistor 24 outputs, as a reset signal (reset level) Vreset, a potential of the FD portion 26 after the reset performed by the reset'transistor 23. Furthermore, the amplifier transistor 24 outputs, as a light accumulation signal (signal level) Vsig, the potential of the FD portion 26 after the transfer of the signal charge by the transfer transistor 22.

The selection transistor 25 has a drain electrode connected to a source electrode of the amplifier transistor 24 and a source electrode connected to the vertical signal line 17, for example. To a gate electrode of the selection transistor 25, a High-active selection pulse φSEL is transmitted through the selection line 163. As a result, the selection transistor 25 becomes an on state and relays a signal that is output from the amplifier transistor 24 to the vertical signal line 17 with the unit pixel 20 being a selected state.

It should be noted that the selection transistor 25 may have a circuit structure of being connected between the pixel power source Vdd and the drain of the amplifier transistor 24.

In addition, the unit pixel 20 is not limited to have the pixel structure constituted of the four transistors described above. For example, the unit pixel 20 may have a pixel structure constituted of three transistors, one of which doubles as the amplifier transistor 24 and the selection transistor 25, and the structure of the pixel circuit is not limited.

(Pupil Correction)

The CMOS image sensor 10 having the above-described structure is provided and used as an image pickup device for an electronic apparatus having an image taking function, such as a digital still camera, a video camera, and a mobile phone. In use, generally, a known technique called pupil correction is applied to a thin camera lens whose exit pupil distance is short, for the purpose of reducing limb darkening.

The pupil correction is the following technique. That is, first, in a center potion of the pixel array portion 11 that is an imaging surface, a center of the micro lens that takes light incident on the respective pixels 20 is coincided with a center of an opening of the photodiode 21 (that is, an area gravity center of the photodiode 21). Here, the lens is formed of a rotationally symmetric plane around an axis, and the axis of the rotation symmetry functions as an optical axis. Further, a point at which the axis of the rotation symmetry intersects a spherical surface of the lens corresponds to the center of the micro lens. Incidentally, a pixel position of the center of the pixel array portion 11 is referred to as an image height of 0%.

On the other hand, in the peripheral portion of the pixel array portion 11, toward outside, a position of the center of the micro lens is shifted from the center of the opening of the photodiode 21 in a direction of a main light beam. Here, the main light beam refers to one light beam that passes the center of the micro lens. Further, the main light beam that passes the center of the micro lens of each of the pixels is coincided with the optical axis of the micro lens in the center portion of the pixel array portion 11. Meanwhile, the main light beam that passes the center of the micro lens of each of the pixels inclines with respect to the optical axis in the peripheral portion of the pixel array portion 11. Incidentally, corners of the peripheral portion of the pixel array portion 11, that is, the pixel positions that are farthest from the center of the pixel array portion 11 are referred to as an image height of 100%.

As described above, the technique of providing an offset between the center position of the micro lens and the center of the opening of the photodiode 21 in the peripheral portion of the pixel array portion 11 is the pupil correction. By using the technique of the pupil correction, the camera lens is increasingly thinned. Therefore, even when light incident on the micro lens enters the imaging surface at various angles, mechanical vignetting of light can be avoided around the opening portion of the photodiode 21. As a result, the light collection efficiency of the respective pixels 20 can be almost the same over the entire pixel array portion 11 (entire imaging surface), and thus the overall performance of the sensitivity can be improved.

The CMOS image sensor 10 of the application example of the present invention described above has the waveguide structure in which the waveguide is provided in the center portion of the pixel for the purpose of efficiently guiding incident light on the pixels 20 to the photodiode 21 (that is, increasing the light collection efficiency). Further, the present invention is characterized in that a structure for reducing a loss of the light amount in a path (optical path) that guides light taken by the micro lens to the photodiode 21 through the waveguide in the CMOS image sensor 10 having the waveguide structure. A description will be given on specific embodiments for reducing the loss of the light amount.

2. First Embodiment (Pixel Structure)

Figure 3:
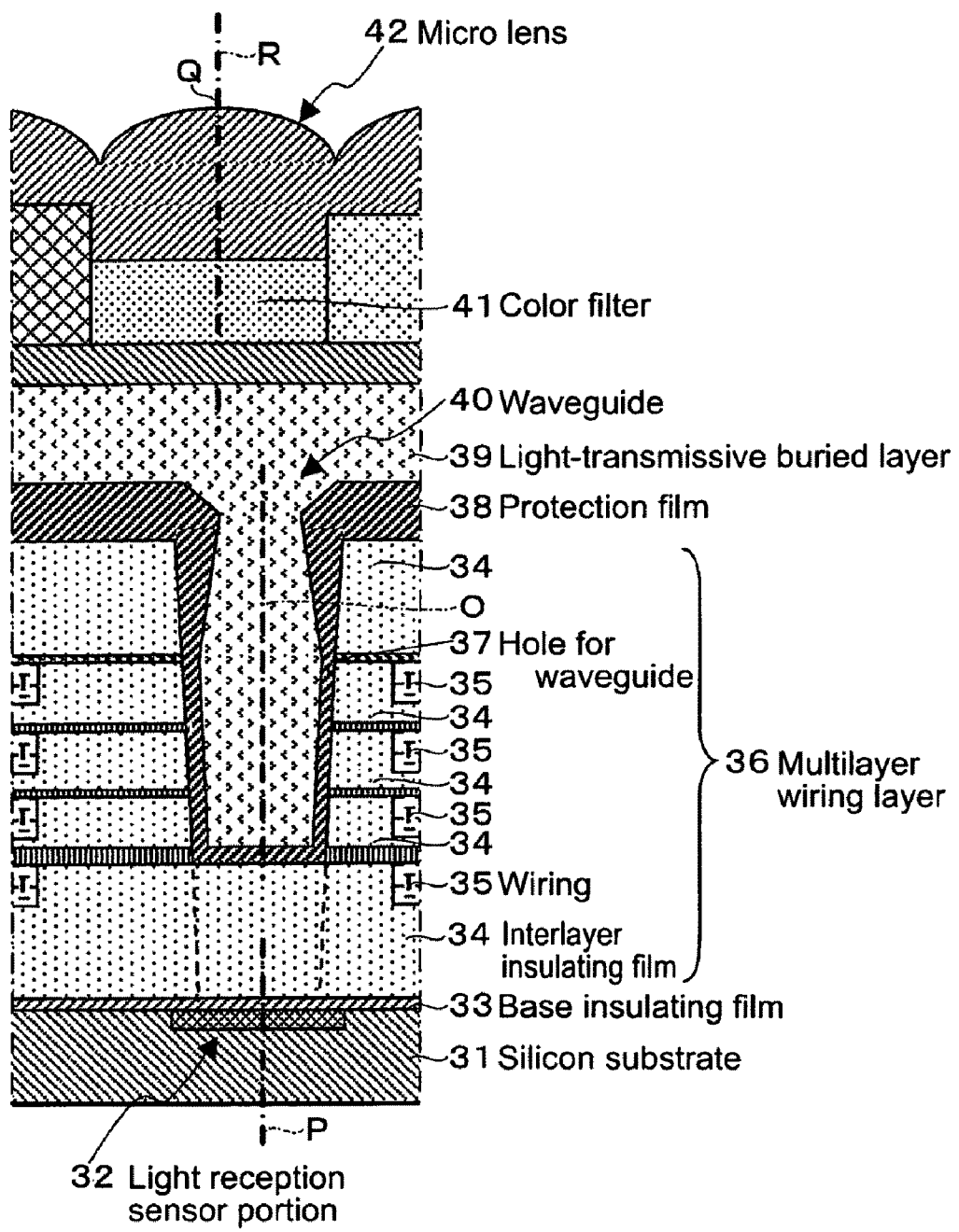
FIG. 3 is a cross-sectional view showing a cross-sectional structure of a pixel having a waveguide structure according to a first embodiment of the present invention.
Figure 4:
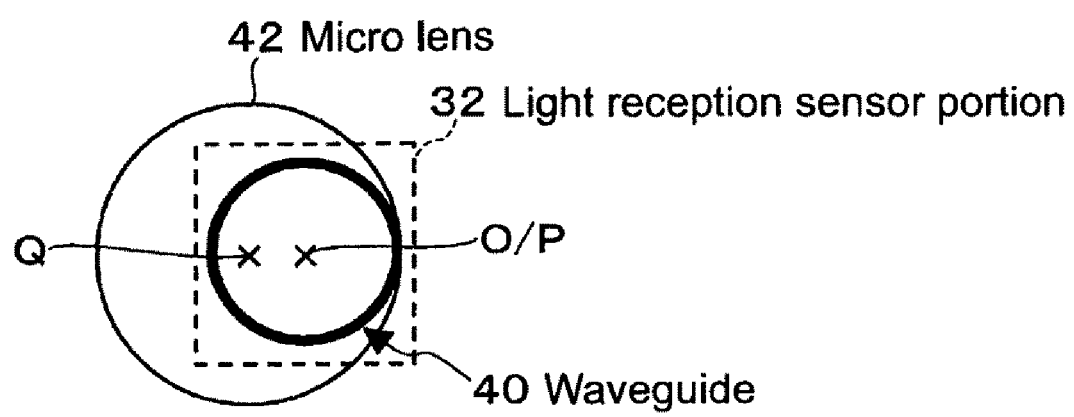
FIG. 4 is a plan view showing a positional relationship among a micro lens, a waveguide, and a photodiode in the waveguide structure according to the first embodiment.

FIG. 3 is a cross-sectional view showing a cross-sectional structure of a pixel having a waveguide structure according to a first embodiment of the present invention. Here, for simplification of the figure, the waveguide structure of a certain unit pixel 20 that is disposed in the center portion of the pixel array portion 11 is shown. FIG. 4 is a diagram showing a positional relationship among a micro lens, a waveguide, and a photodiode in the waveguide structure according to the first embodiment.

In FIG. 3, in a subsurface portion of a semiconductor substrate, for example, a silicon substrate 31, a light reception sensor portion (photoelectric converter) 32 that performs photoelectric conversion is formed. The light reception sensor portion 32 is formed as a diode (that corresponds to the photodiode 21 shown in FIG. 2) constituted of a P-type diffusion layer and an N-type diffusion layer on a surface side thereof, for example. The light reception sensor portion 32 may have a structure in which the surface is further covered with a hole accumulation layer formed of a P-type diffusion layer.

On the silicon substrate 31, an interlayer insulating film 34 is formed through a base insulating film 33. On a surface side of the interlayer insulating film 34, a wiring 35 is formed by embedding a conductive material in a groove pattern. Further, the formation of the interlayer insulating film 34 and the formation of the wiring 35 in the groove pattern are repeatedly performed, and the interlayer insulating film 34 is formed at the end, thereby forming a multilayer wiring layer 36.

In a part of the multilayer wiring layer 36, which is positioned above the light reception sensor 32 (photodiode 21), a hole 37 for a waveguide is formed. A center (that is, a center of a lateral cross section of the hole 37) O of the hole 37 is formed to desirably coincide with a center (that is, a gravity center of an area of the light reception sensor portion 32) P of an opening of the light reception sensor portion 32. Further, the hole 37 is formed so that an area of a bottom portion thereof is smaller than the area of the light reception sensor portion 32.

Inside the hole 37, a waveguide film 38 is formed along an inner wall surface, that is, an exposure surface of the multilayer wiring layer 36. Then, in an inner side of the waveguide film 38, a light-transmissive buried layer (transparent film) 39 is buried, thereby forming a waveguide 40. As a result, the center O of the hole 37 corresponds to a center of the waveguide 40. Therefore, the center O of the waveguide 40 is coincided with the area gravity center P of the light reception sensor portion 32. Here, the center of the waveguide 40 refers to the center of a lateral cross section of the waveguide 40. Further, an area of an end portion of the waveguide 40 on a light exit side (lower side of FIG. 3) is smaller than the area of the light reception sensor portion 32.

Above the waveguide 40, a color filter 41 of a predetermined color is formed. On the color filter 41, a lens, specifically, a micro lens 42 called on-chip lens is provided. Here, although the center O of the waveguide 40 is coincided with the area gravity center P of the light reception sensor portion 32, a center Q of the micro lens 42 is formed so as to be shifted from the center O of the waveguide 40.

At this time, the center O of the waveguide 40 is shifted from a main light beam that passes the center Q of the micro lens 42 in a direction in which an area where the waveguide 40 and the light reception sensor portion 32 are overlapped is increased. Here, in the center portion of the pixel array portion 11, because light enters the micro lens 42 in parallel to an optical axis R including the center Q, the main light beam that passes the center Q coincides with the optical axis R.

On the other hand, in the peripheral portion of the pixel array portion 11, because light enters the micro lens 42 obliquely with respect to the optical axis R including the center Q, the main light beam that passes the center Q has an angle with respect to the optical axis R. Accordingly, in the CMOS image sensor that uses the technique of the pupil correction described above, for the shifting of the center O of the waveguide 40 with respect to the center Q of the micro lens 42, the main light beam that passes the center Q is used as a reference, instead of using the center Q or the optical axis R of the micro lens 42 as a reference.

(Manufacturing Method)

Figure 5:
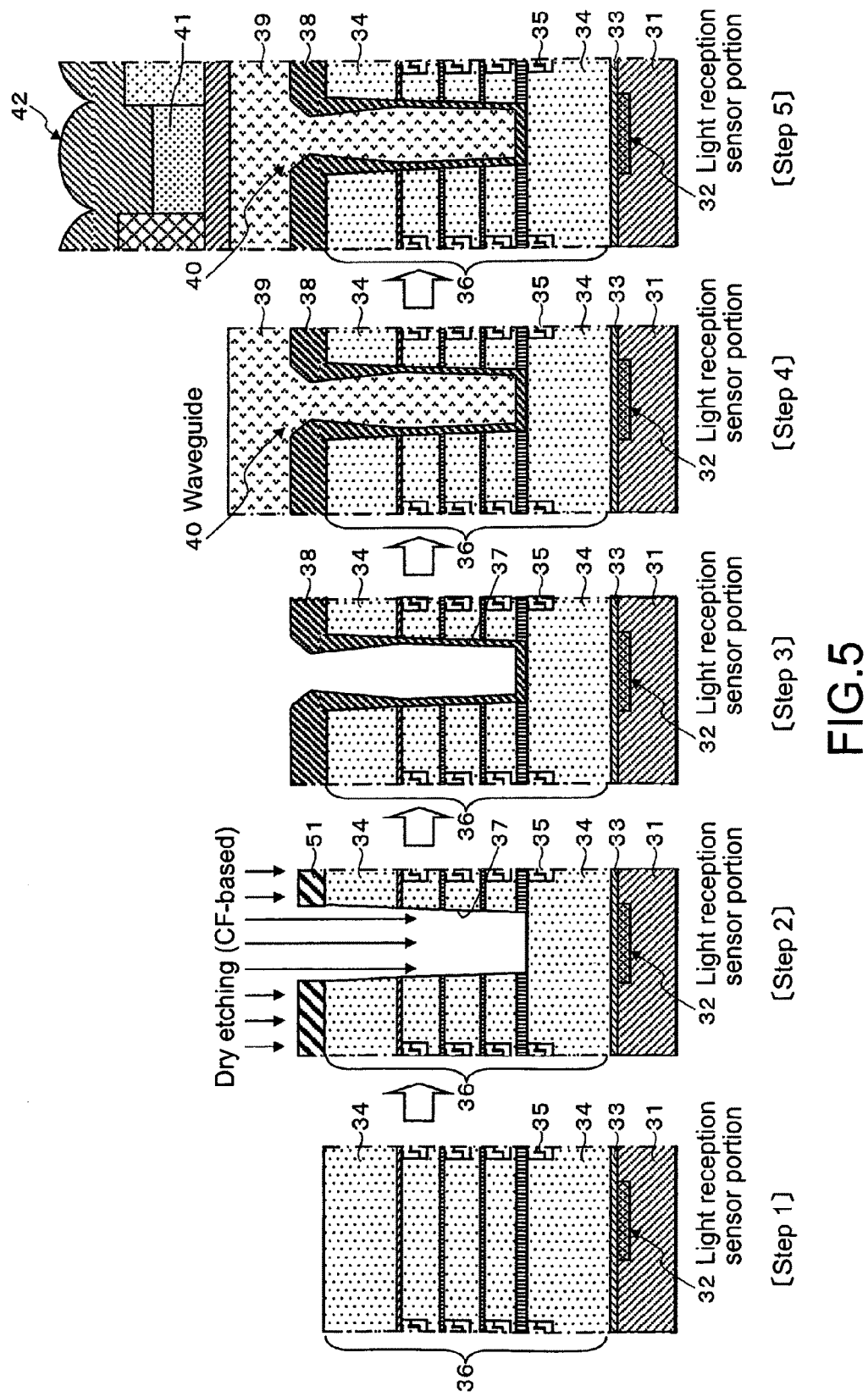
FIG. 5 is a process diagram showing an example of steps of a manufacturing method of the pixel having the waveguide structure according to the first embodiment.

Subsequently, with reference to a process diagram of FIG. 5, a description will be given on an example of steps of a manufacturing method of the pixel having the waveguide structure according to the first embodiment. In FIG. 5, the same components as those of FIG. 3 are denoted by the same reference numerals.

(Step 1: Formation Up to Multilayer Wiring Layer 36)

On the silicon substrate 31, in the subsurface portion of which the light reception sensor portion 32 is formed, the base insulating film 33 is formed. Next, on the base insulating film 33, the interlayer insulating film 34 is formed, and then the groove pattern is formed on the surface side of the interlayer insulating film 34. In the groove pattern, for example, metal is embedded, thereby forming the wiring 35. The formation of the interlayer insulating film 34 and the formation of the wiring 35 in the groove pattern are repeatedly performed, and the interlayer insulating film 34 is finally formed, with the result that the multilayer wiring layer 36 is formed.

(Step 2: Formation of Hole 37 for Waveguide)

Next, a dry etching is performed by using, for example, a CF-based gas, thereby forming the hole 37 for the waveguide in the multilayer wiring layer 36 by using a resist mask 51. In this case, the hole 37 is laid out so that an area where the hole 37 for the waveguide is overlapped with the light reception sensor portion 32 is large. As a result, the center O of the waveguide 40 is positioned so as not to correspond to the center Q (optical axis R) of the micro lens 42. It is desirable to set the shift amount of the center O of the waveguide 40 from the center Q of the micro lens 42 in this case to about 10 to 200 nm for minimizing the loss of the light amount.

Figure 6:
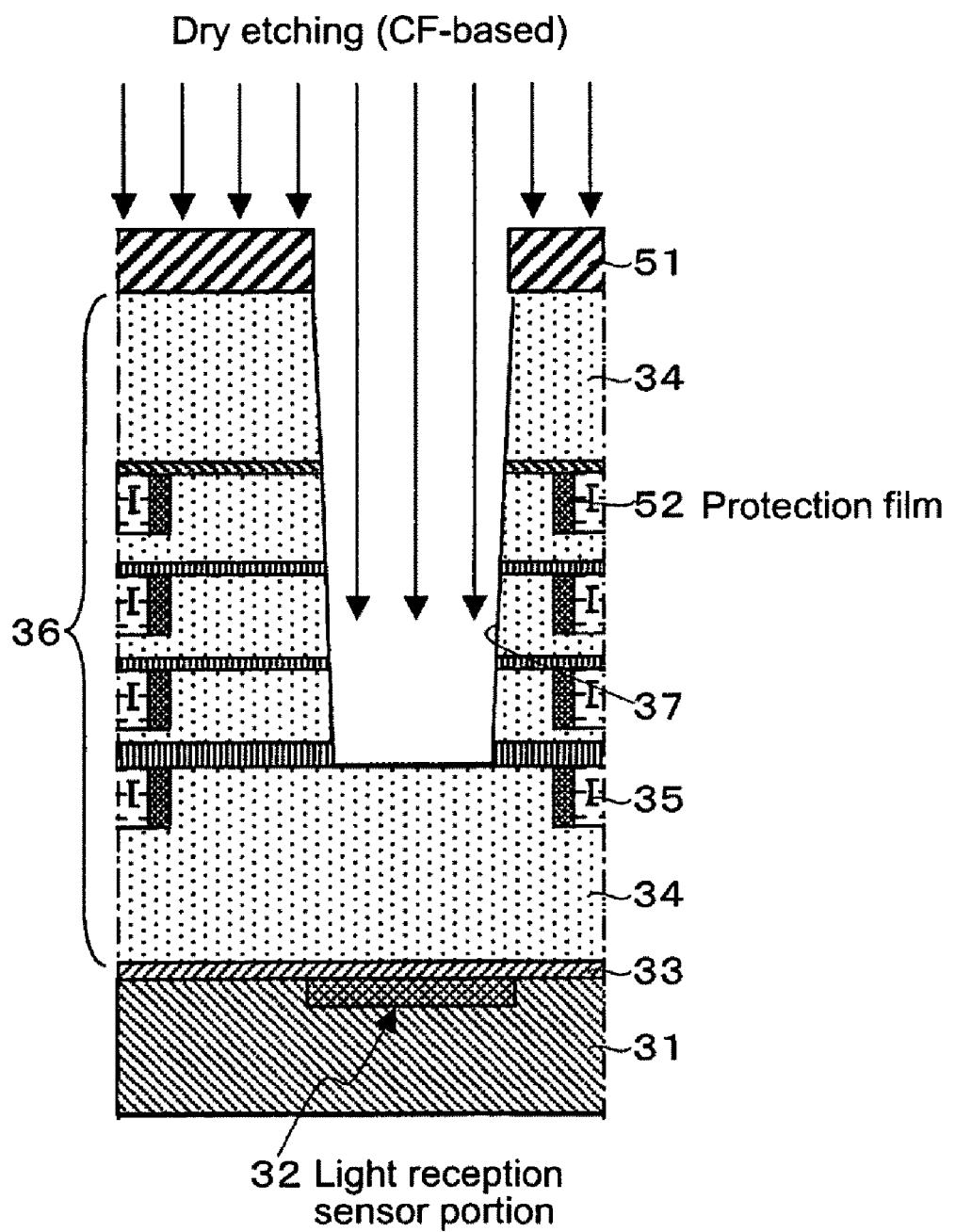
FIG. 6 is a diagram showing a modified example of the manufacturing method according to the first embodiment.

In addition, for preventing the wiring layer 35 made of the metal from being exposed to outside, the following two manufacturing methods may be employed. One is a method of forming the diameter of the hole 37 for the waveguide into a small size to maintain a distance between the waveguide 40 and the wiring 35. The other one is a method of forming a protection layer 52 made of a material whose etching rate is different from that of the interlayer insulating film 34 of the multilayer wiring layer 36, specifically, a material whose etching rate is lower than that of the interlayer insulating film 34 (material that is difficult to be etched), as shown in FIG. 6. Here, the etching rate refers to a rate per unit at a time when an etching-target film is etched.

(Step 3: Formation of Waveguide Film 38)

Next, on the multilayer wiring layer 36 and on the inner wall of the hole 37 for the waveguide, that is, on the exposed surface of the multilayer wiring layer 36, a waveguide film 38 is formed. The waveguide film 38 can be made of a known material used for a waveguide structure in related art.

(Step 4: Burying in Hole 37 for Waveguide)

Next, a light-transmissive material is buried in the hole 37 for the waveguide through the waveguide film 38, thereby forming a light-transmissive buried layer 39. As the light-transmissive material to be buried in this case, a known material used in the waveguide structure in related art, that is, a material having high refractive index can be used. The waveguide film 38 and the light-transmissive buried layer 39 constitute the waveguide 40.

(Step 5: Formation of Color Filter 41 and Micro Lens 42)

Finally, the color filter 41 corresponding to each sub pixel is formed on the multilayer wiring layer 36 through the light-transmissive buried layer 39 for each pixel, and then the micro lens 42 is formed on the color filter 41 for each pixel.

(Operation and Effect)

As described above, the waveguide structure according to the first embodiment has the structure in which the center O of the waveguide 40 is shifted from the main light beam that passes the center Q of the micro lens 42 in the direction in which the area where the waveguide 40 is overlapped with the light reception sensor portion 32 is increased. Further, with the waveguide structure according to the first embodiment, the following operation and effect can be obtained.

That is, when the waveguide structure according to this embodiment is used, the loss of the light amount caused between the micro lens 42 and the waveguide 40 is slightly larger than that in a case where the center O of the wave guide 40 is coincided with the center Q of the micro lens 42. Meanwhile, the area where the waveguide 40 is overlapped with the light reception sensor portion 32 is large, and therefore light collected (confined) in the waveguide 40 is efficiently guided to the light reception surface of the light reception sensor portion 32.

Figure 7:
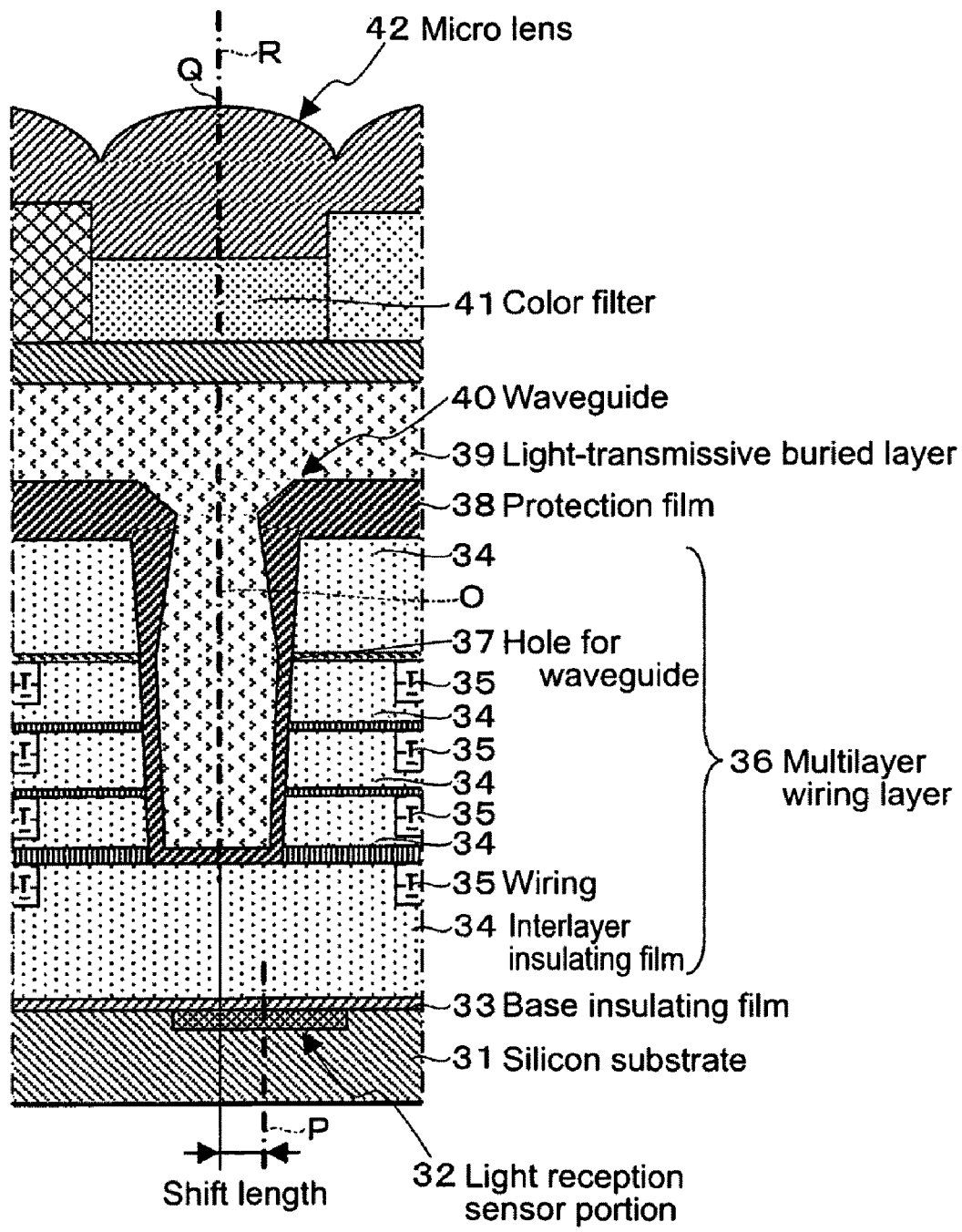
FIG. 7 is a cross-sectional view showing an example of a cross-sectional structure of a unit pixel having a waveguide structure in related art.
Figure 8:
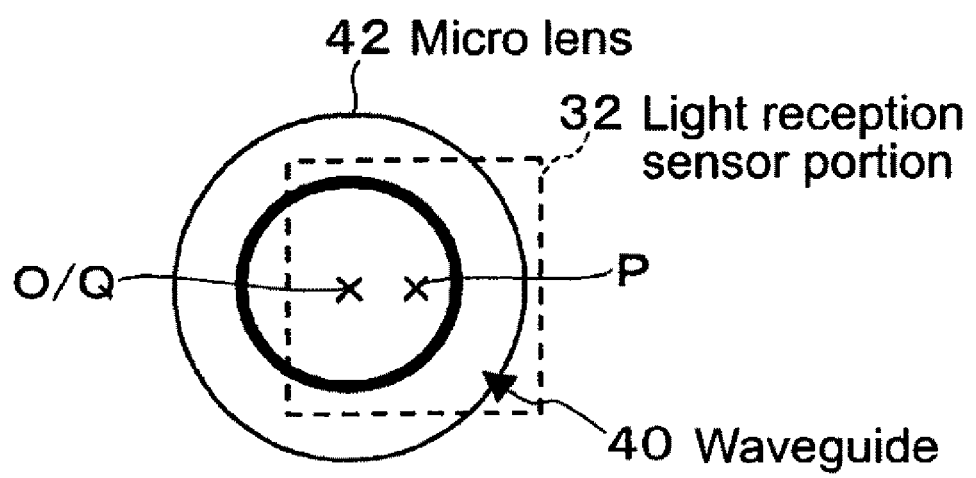
FIG. 8 is a plan view showing a positional relationship among a micro lens, a waveguide, and a photodiode in the waveguide structure in related art.

Here, as shown in FIGS. 7 and 8, the loss of the light amount between the waveguide 40 and the light reception sensor portion 32 is smaller than that between the waveguide 40 and the light reception sensor portion 32 in the case where the area gravity center P of the light reception sensor portion 32 is shifted from the center Q of the micro lens 42 or the center O of the waveguide 40. In particular, the center O of the waveguide 40 and the area gravity center P of the light reception sensor portion 32 are coincided, and the area of the end portion of the waveguide 40 on the light exit side is smaller than the area of the light reception sensor portion 32. For those reasons, the loss of the light amount between the waveguide 40 and the light reception sensor portion 32 can be minimized.

Thus, by using the pixel structure according to this embodiment, in which the center O of the waveguide 40 is shifted from the main light beam that passes the center Q of the micro lens 42, it is possible to reduce the loss of the light amount totally in the path (optical path) between the micro lens 42 and the light reception sensor portion 32. That is, the loss of the light amount in the path between the micro lens 42 and the light reception sensor portion 32 can be reduced to a larger extent than the case where the area gravity center P of the light reception sensor portion 32 is shifted from the center Q of the micro lens 42 or the center O of the waveguide 40, as shown in FIGS. 7 and 8. In FIGS. 7 and 8, the same components as shown in FIGS. 3 and 4 are denoted by the same reference numerals or symbols.

Figure 9:
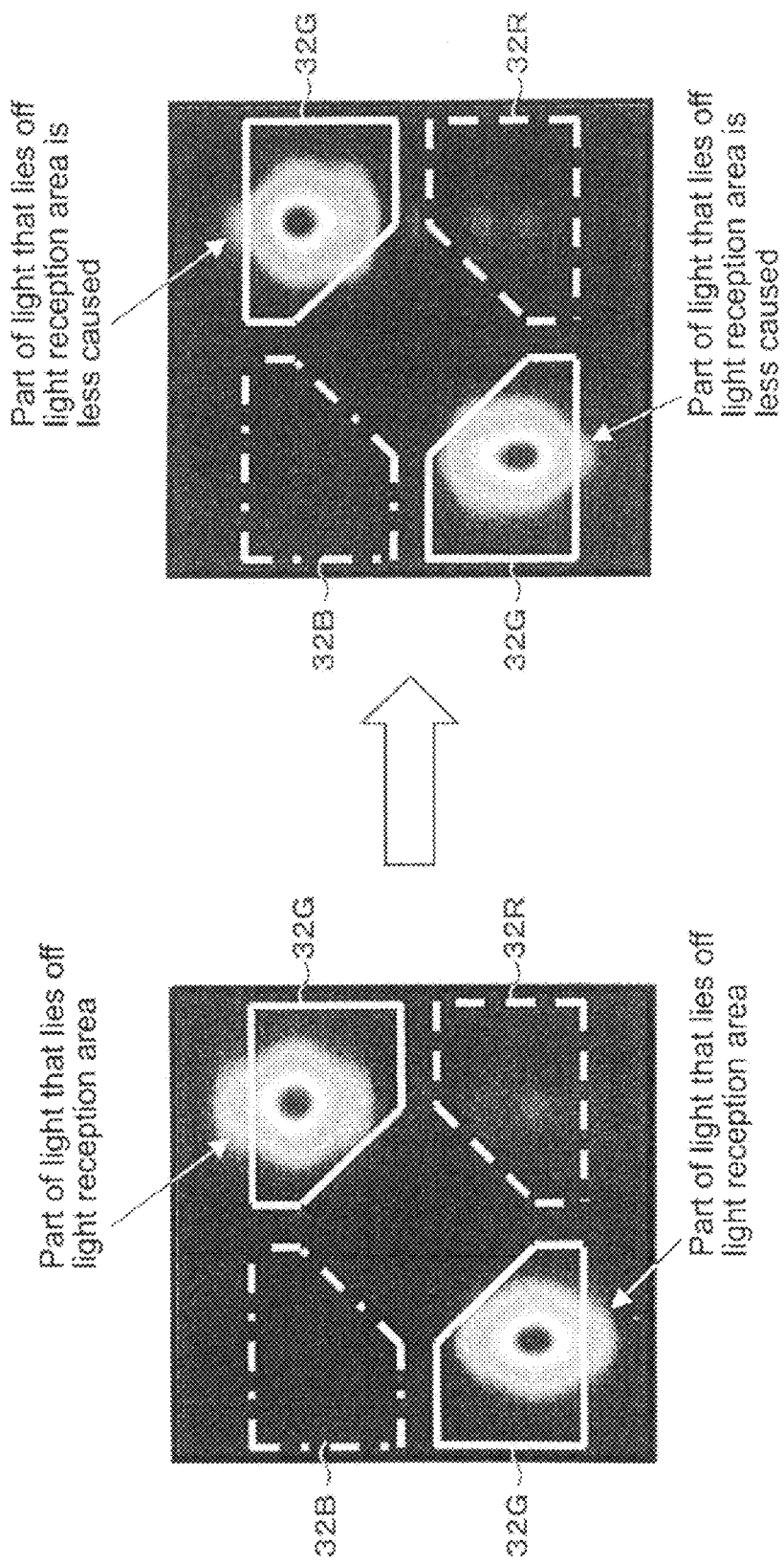
FIG. 9 are diagrams showing a simulation result relating to an energy distribution on a light reception area, in which a case of the waveguide structure in related art (FIG. 9A) and a case of the waveguide structure according to the first embodiment (FIG. 9B) are compared.

FIGS. 9A and 9B are diagrams showing a simulation result relating to an energy distribution on the light reception area of the light reception sensor portion 32. In FIGS. 9A and 9B, a case of the waveguide structure in related art (FIG. 9A) and a case of the waveguide structure according to the first embodiment (FIG. 9B) are compared.

In a case where the CMOS image sensor 10 is used for color display, one pixel as a unit that forms a color image is constituted of a plurality of sub pixels, and the sub pixels correspond to the pixel 20. More specifically, one pixel is constituted of three sub pixels, that is, a sub pixel that receives red (R) light, a sub pixel that receives green (G) light, and a sub pixel that receives blue (B) light.

FIGS. 9A and 9B show a case where one pixel is constituted of two G sub pixels, an R sub pixel, and a B sub pixel. Further, in FIGS. 9A and 9B, light reception areas (area of the light reception sensor portion 32) 32G of the G sub pixels each are indicated by the solid line, a light reception area 32R of the R sub pixel is indicated by the broken line, and a light reception area 32B of the B sub pixel is indicated by the dash-dotted line. In addition, in this simulation result, an energy distribution of the green light that enters the light reception areas 32G of the two G sub pixels is shown as a representative of the sub pixels.

In the case of the waveguide structure of the related art example in which the area gravity center P of the light reception sensor portion 32 is shifted from the center Q of the micro lens 42 or the center O of the waveguide 40, as shown in FIG. 9A, light that enters the light reception areas 32G partly goes off (deviates from) the light reception area 32G. As a result, the loss of the light amount corresponding to the degree of the deviation is generated between the waveguide 40 and the light reception sensor portion 32, which degrades the sensitivity (parallel optical sensitivity) of the pixel.

In contrast, in the case where the waveguide structure according to this embodiment, as apparent from FIG. 9B, it is possible to prevent the incident light on the light reception area 32G from going off the light reception area 32G. This is because, in particular, the center O of the waveguide 40 and the area gravity center P of the light reception sensor portion 32 are coincided, and the area of the end portion of the waveguide 40 on the light exit side is smaller than that of the light reception sensor portion 32. Further, the sensitivity of the pixel can be improved by the amount of light that is suppressed from going off the light reception area 32G.

As described above, by using the waveguide structure according to this embodiment, the sensitivity can be improved as compared to the waveguide structure of the related art example. Thus, it is possible to respond to further miniaturization of the pixel size. Specifically, when the further miniaturization of the pixel size is advanced, the degree of freedom of the layout of the light reception sensor portion 32 or the pixel transistor (transistors 22 to 25 of FIG. 2) on the substrate is lost. As a result, even when the area gravity center P of the light reception sensor portion 32 is shifted from the center Q of the micro lens 42, it is possible to minimize the sensitivity degradation due to the deviation of the part of incident light from the light reception sensor portion 32, which can contribute to the further miniaturization of the pixel size.

It should be noted that in this embodiment, the position of the end portion of the waveguide 40 on the light exit side is set up to the position of the wiring 35 in the lowermost layer of the multilayer wiring layer 36, but is not limited to this. For example, as indicated by the broken line of FIG. 3, the position of the end portion of the waveguide 40 on the light exit side can be set to a position in contact with the light reception surface of the light reception sensor portion 32. With this structure, the loss of the light amount between the waveguide 40 and the light reception sensor portion 32 can be suppressed as compared to the case of the structure of FIG. 3 in which the end portion of the waveguide 40 on the light exit side is apart from the light reception surface of the light reception sensor portion 32.

3. Second Embodiment

Pixel Structure

Figure 10:
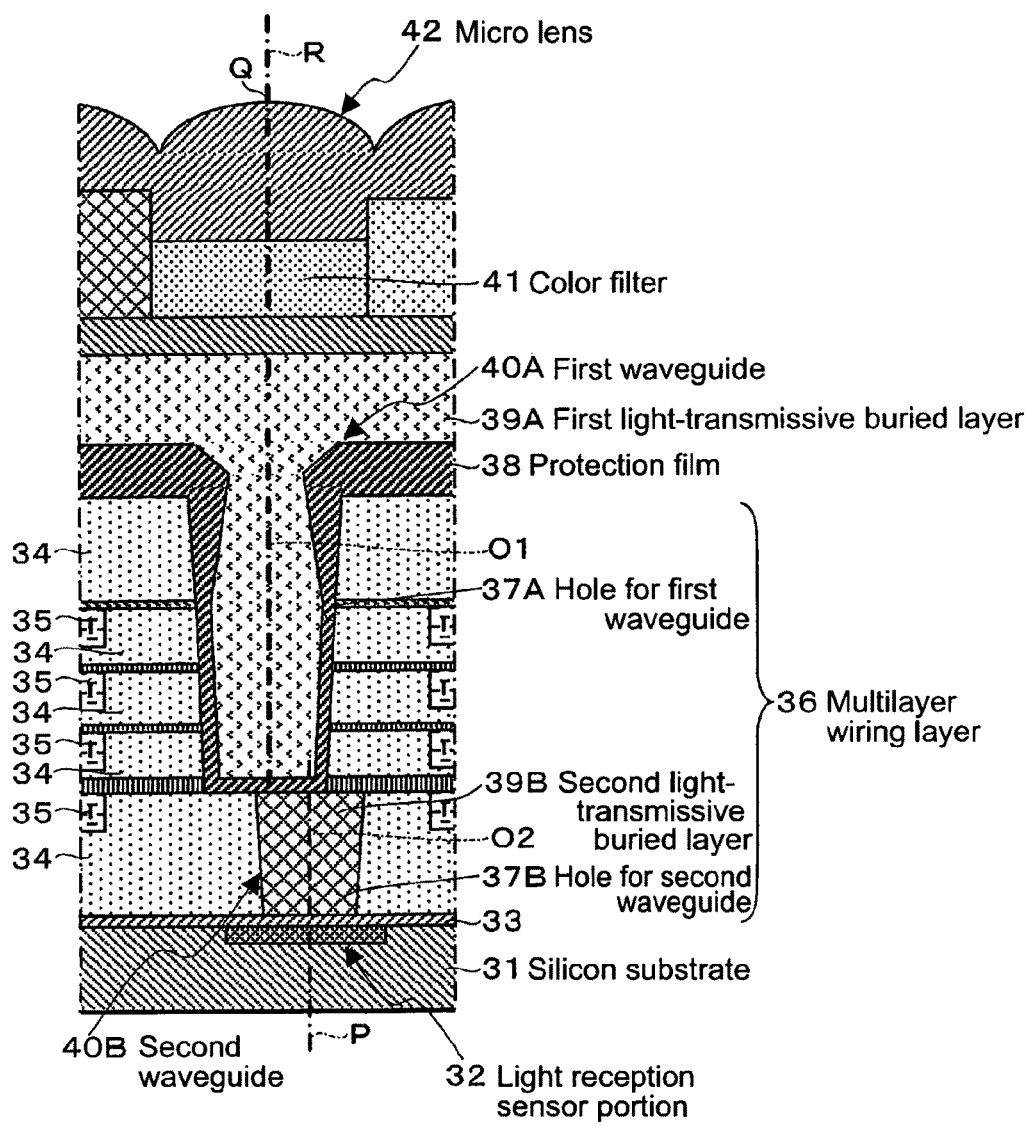
FIG. 10 is a cross-sectional view showing a cross-sectional structure of a pixel having a waveguide structure according to a second embodiment of the present invention.

FIG. 10 is a cross-sectional view showing a cross-sectional structure of a pixel having a waveguide structure according to a second embodiment of the present invention. In FIG. 10, the same components shown in FIG. 3 are denoted by the same reference numerals or symbols.

Figure 11:
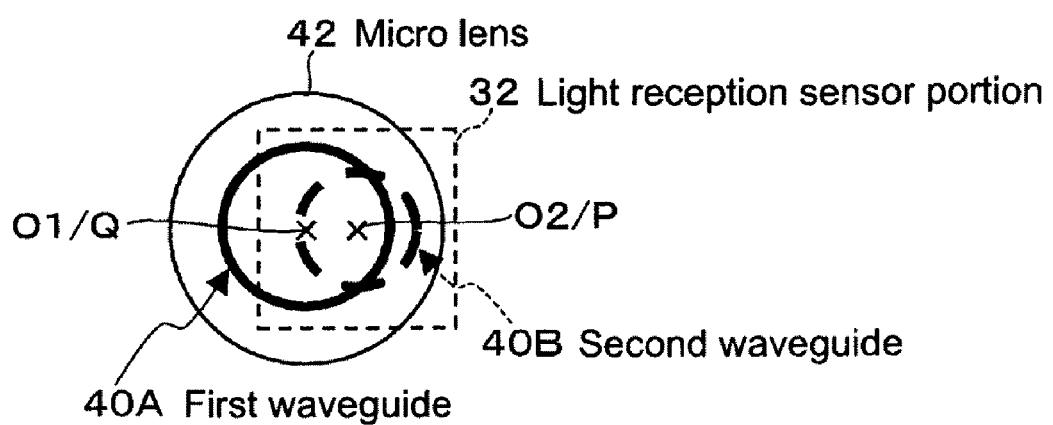
FIG. 11 is a plan view showing a positional relationship among a micro lens, a waveguide, and a photodiode in the waveguide structure according to the second embodiment.

Here, for simplification of the figure, the waveguide structure of the certain unit pixel 20 that is disposed in the center portion of the pixel array portion 11 is shown. FIG. 11 is a diagram showing a positional relationship among the micro lens, the waveguide, and the photodiode in the waveguide structure according to the second embodiment.

In the waveguide structure of the first embodiment, the waveguide 40 has the single-stage structure, and the center O of the waveguide 40 is shifted from the main light beam that passes the center Q of the micro lens 42 in the direction in which the area where the waveguide 40 is overlapped with the light reception sensor portion 32 is increased.

In contrast, in the waveguide structure of the second embodiment, first, the waveguide 40 is set to have a multi-stage structure, for example, two-stage structure. Specifically, the waveguide 40 has the two-stage structure of a first waveguide 40A and a second waveguide 40B. The first waveguide 40A is disposed on a side close to the micro lens 42 (upper side in FIG. 10), and the second waveguide 40B is disposed on a side close to the light reception sensor portion 32 (lower side in FIG. 10).

In the waveguide 40 having the two-stage structure, a center O1 of the first waveguide 40A is positioned so as to coincide with the main light beam (in this example, coincide with the optical axis R) that passes the micro lens 42. Here, the center O1 of the first waveguide 40A refers to a center of a lateral cross section of the first waveguide 40A. In addition, an end portion of the first waveguide 40A on a light exit side is in contact with an end portion of the second waveguide 40B on a light incident side.

On the other hand, a center O2 of the second waveguide 40B is shifted from the main light beam that passes the center of the micro lens 42 in the direction in which the area where the waveguide 40 and the light reception sensor portion 32 are overlapped is increased. Here, the center O2 of the second waveguide 40B refers to a center of a lateral cross section of the second waveguide 40B.

More specifically, in order to minimize the loss of the light amount between the second waveguide 40B and the light reception sensor portion 32, it is desirable to form the second waveguide 40B so that the center O2 of the second waveguide 40B coincides with the area gravity center P of the light reception sensor portion 32. Further, an area of the end portion (lower end portion in FIG. 10) of the second waveguide 40B on the light exit side is set to be smaller than the light reception area of the light reception sensor portion 32, and the end portion on the light exit side is in contact with the light reception surface of the light reception sensor portion (in actuality, in contact in a state where the base insulating film 33 is intervened therebetween).

(Manufacturing Method)

Figure 12:
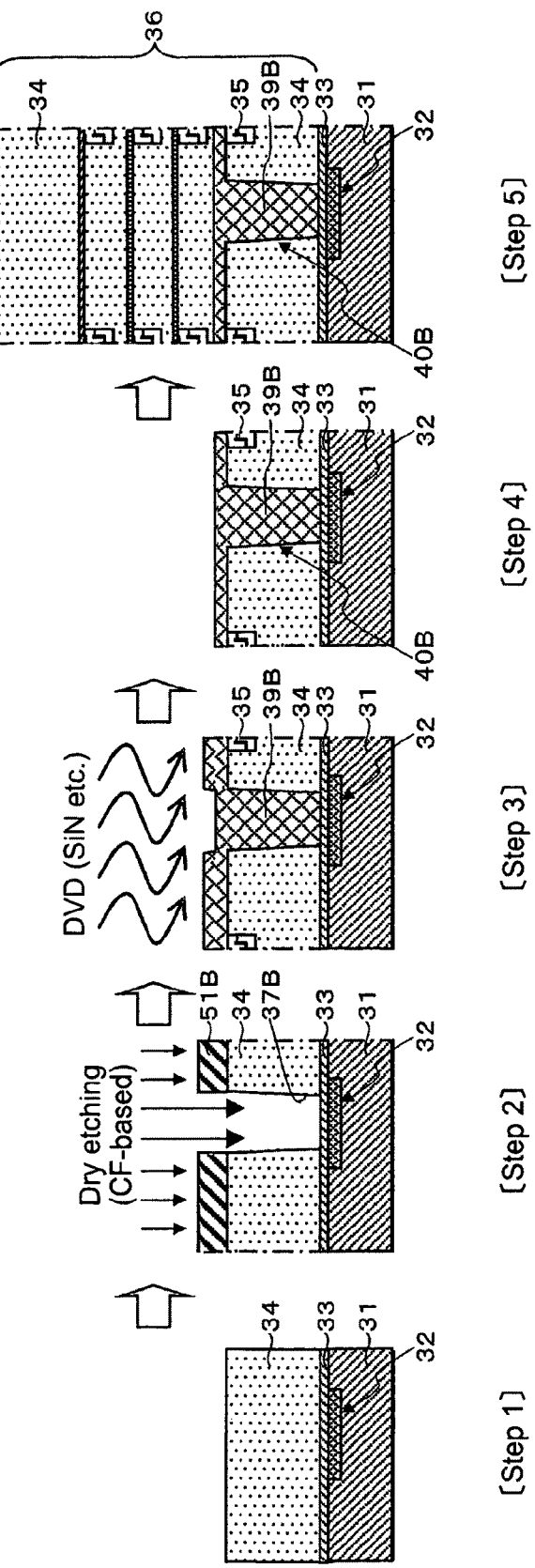
FIG. 12 is a process diagram (part 1) showing an example of steps of a manufacturing method of a pixel having the waveguide structure according to the second embodiment.
Figure 13:
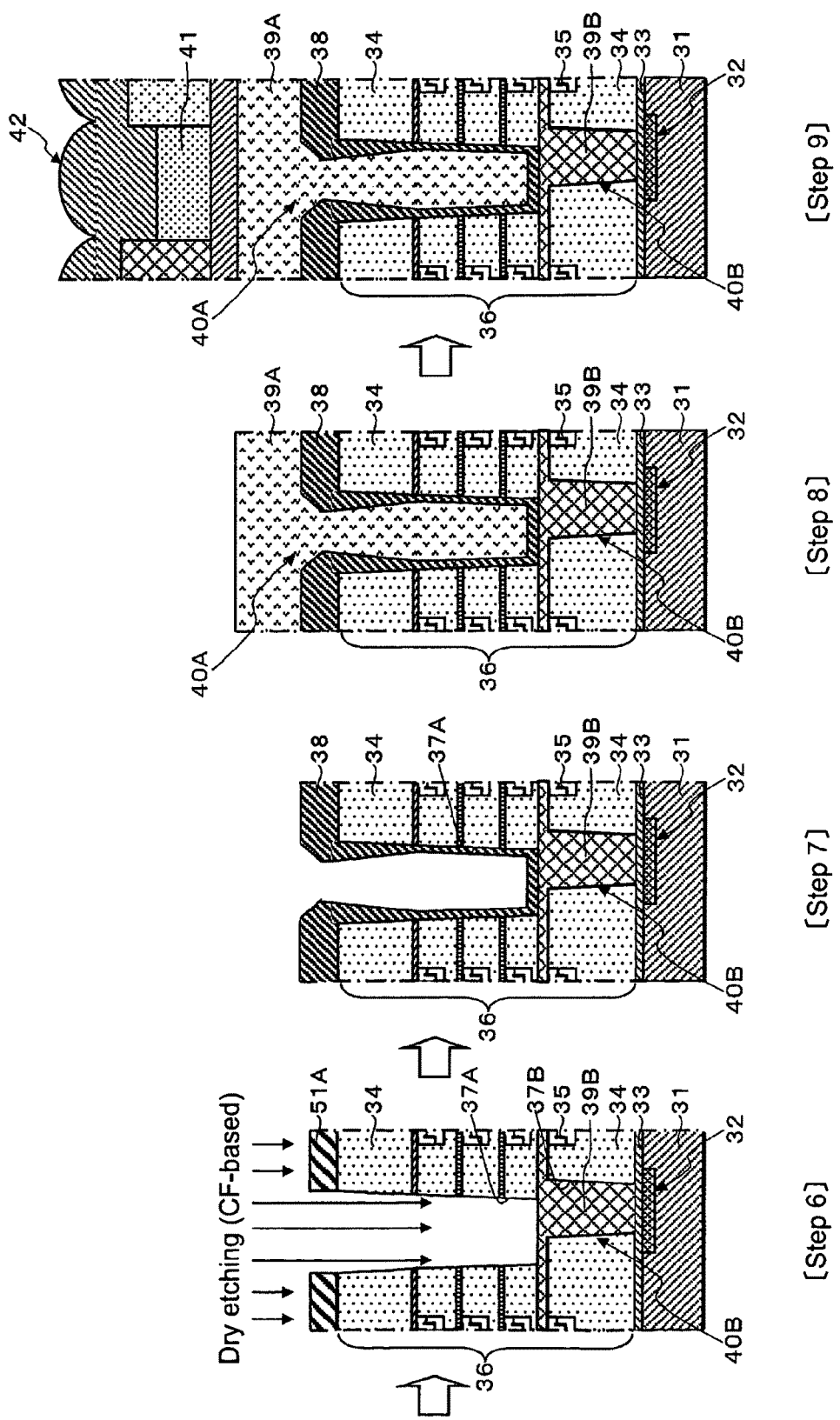
FIG. 13 is a process diagram (part 2) showing an example of steps of a manufacturing method of the pixel having the waveguide structure according to the second embodiment.

Subsequently, with reference to a process diagram of each of FIGS. 12 and 13, a description will be given on an example of steps of a manufacturing method of the pixel having the waveguide structure according to the second embodiment. In FIGS. 12 and 13, the same components as those of FIG. 10 are denoted by the same reference numerals or symbols.

(Step 1: Formation up to Interlayer Insulating Film 34 in Lowermost Layer)

On the silicon substrate 31, in the subsurface portion of which the light reception sensor portion 32 is formed, the base insulating film 33 is formed. Next, on the base insulating film 33, the interlayer insulating film 34 in the lowermost layer of the multilayer wiring layer 36 is formed.

(Step 2: Formation of Hole 37B for Second Waveguide 40B)

Next, a dry etching is performed by using, for example, a CF-based gas, thereby forming a hole 37B for the second waveguide 40B in the lowermost interlayer insulating film 34 by using a resist mask 51B. In this case, the hole 37B for the second waveguide 40B is laid out so that an area where the hole 37B is overlapped with the light reception sensor portion 32 is large.

(Step 3: Burying in Hole 37B for Second Waveguide 40B)

Next, in the hole 37B for the second waveguide 40B, a light-transmissive material such as SiN is buried by a CVD (chemical vapor deposition) method or the like, thereby forming a second light-transmissive buried layer (transparent film) 39B is formed. The second light-transmissive buried layer 39B forms the second waveguide 40B. It is desirable to set an area of an end portion (lower end portion) of the second waveguide 40B on the light exit side to be smaller than the light reception area of the light reception sensor portion 32.

(Step 4: Flattening)

A surface of the second light-transmissive buried layer 39B buried in the hole 37B for the second waveguide 40B is polished by a CMP (chemical mechanical polishing) or the like, thereby flattening the surface.

(Step 5: Formation of Multilayer Wiring Layer 36)

Next, the interlayer insulating film 34 is formed on the second light-transmissive buried layer 39B, and then a groove pattern is formed on the surface side of the interlayer insulating film 34. In the groove pattern, for example, metal is embedded, thereby forming the wiring 35. The formation of the interlayer insulating film 34 and the formation of the wiring 35 in the groove pattern are repeatedly performed, and the interlayer insulating film 34 is finally formed, with the result that the multilayer wiring layer 36 is formed.

(Step 6: Formation of Hole 37A for First Waveguide 40A)

Next, a dry etching is performed by using, for example, a CF-based gas, thereby forming a hole 37A for the first waveguide 40A by using a resist mask 51A. In this case, the hole 37A for the first waveguide 40A is laid out so that an center of the hole 37A (center O1 of the first waveguide 40A) is coincided with the center Q (optical axis R) of the micro lens 42.

(Step 7: Formation of Waveguide Film 38)

Next, on the multilayer wiring layer 36 and on the inner wall of the hole 37A for the first waveguide 40A, that is, on the exposed surface of the multilayer wiring layer 36, the waveguide film 38 is formed. The waveguide film 38 can be made of a known material used for the waveguide structure in related art.

(Step 8: Burying in Hole 37A for First Waveguide 40A)

Next, a light-transmissive material is buried in the hole 37A for the first waveguide 40A through the waveguide film 38, thereby forming a first light-transmissive buried layer 39A. The waveguide film 38 and the first light-transmissive buried layer 39A form the first waveguide 40A.

Here, as the light-transmissive material to be buried in the hole 37A for the first waveguide 40A, that is, as the material of the first waveguide 40A, a known material used for the waveguide structure in related art, that is, a material having a high refractive index can be used. But, it is desirable that the first waveguide 40A is made of the same material as the second waveguide 40B. In addition, it is desirable that the material of the first waveguide 40A has a refractive index that is the same as or close to that of the material of the second waveguide 40B.

By forming the first waveguide 40A and the second waveguide 40B with a single material, reflection in the optical path from the first waveguide 40A to the second waveguide 40B can be eliminated. In addition, when the material of the first waveguide 40A and the material of the second waveguide 40B have the same or close refractive index, an interface in which a refraction is caused can be prevented from being generated in the optical path from the first waveguide 40A to the second waveguide 40B. As a result, the loss of the light amount generated between the first waveguide 40A and the second waveguide 40B can be minimized.

(Step 9: Formation of Color Filter 41 and Micro Lens 42)

Finally, the color filter 41 corresponding to each sub pixel is formed on the multilayer wiring layer 36 through the first light-transmissive buried layer 39A for each pixel, and then the micro lens 42 is formed on the color filter 41 for each pixel.

(Operation and Effect)

As described above, in the waveguide structure according to the second embodiment, the waveguide 40 has, for example, the two-stage structure, and the center O2 of the second waveguide 40B is shifted from the main light beam that passes the center of the micro lens 42 in the direction in which the area where the waveguide 40 and the light reception sensor portion 32 are overlapped is increased. Further, with the waveguide structure according to the second embodiment, the following operation and effect can be obtained.

That is, such a layout that the area where the second waveguide 40B and the light reception sensor portion 32 are overlapped is increased can further suppress the loss of the light amount between the second waveguide 40B and the light reception sensor portion 32 as compared to the case of the waveguide structure in the related art example shown in FIG. 7. In particular, the center O2 of the second waveguide 40B is coincided with the area gravity center P of the light reception sensor portion 32, and the area of the end portion of the second waveguide 40 on the light exit side is set to be smaller than the light reception area of the light reception sensor portion 32, with the result that the loss of the light amount between the second waveguide 40B and the light reception sensor portion 32 can be minimized.

Further, because the center O1 of the first waveguide 40A is coincided with the main light beam that passes the center of the micro lens 42, the loss of the light amount between the micro lens 42 and the first waveguide 40A can be suppressed as compared to the case of the waveguide structure of the first embodiment. As a result, although a slight loss of the light amount is generated between the first waveguide 40A and the second waveguide 40B, the light that enters the micro lens 42 can be efficiently guided to the light reception sensor portion 32 via the first waveguide 40A and the second waveguide 40B, because the end portions of the first and second waveguides 40A and 40B are in contact with each other.

Figure 14:
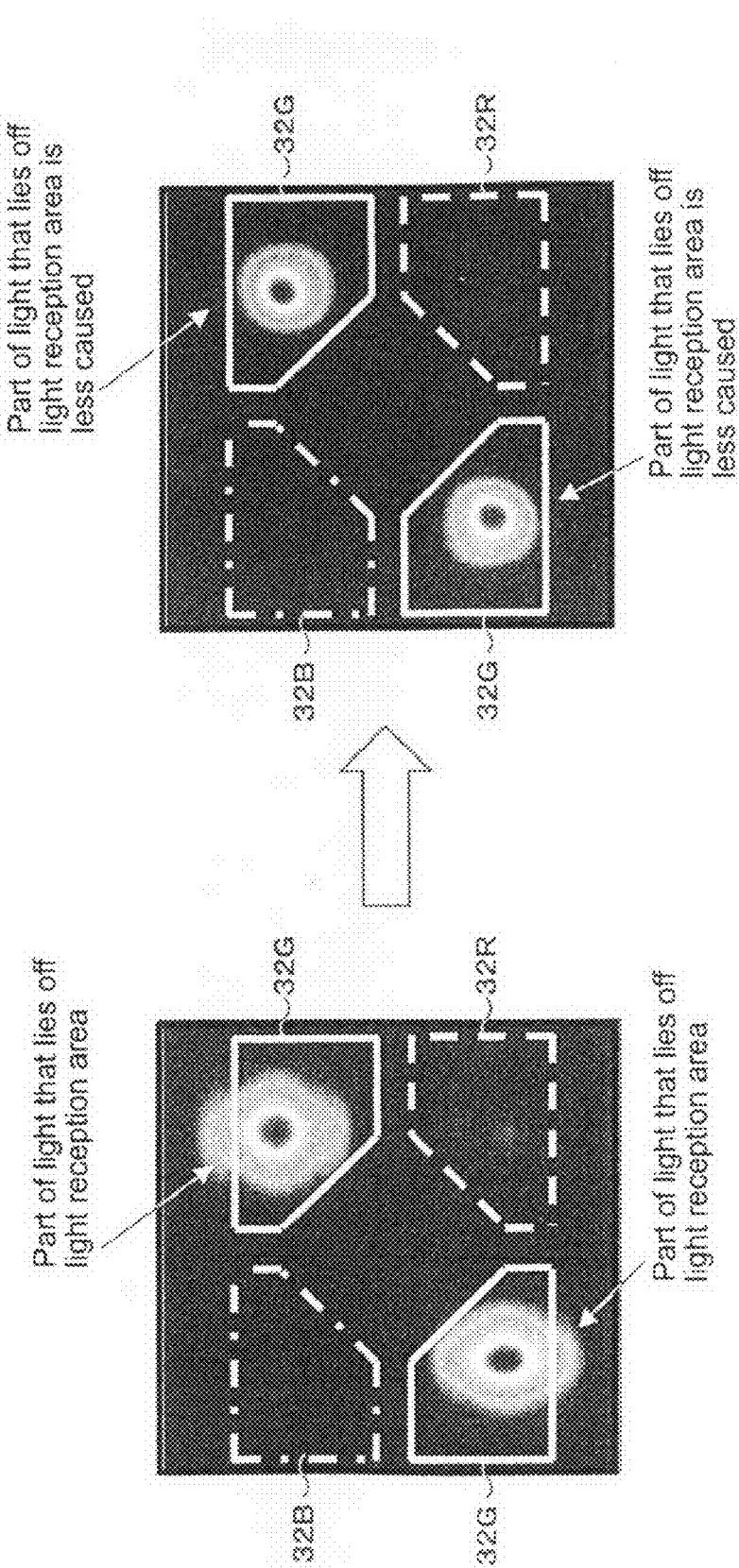
FIG. 14 are diagrams showing a simulation result relating to an energy distribution on the light reception area, in which the case of the waveguide structure in related art (FIG. 9A) and a case of the waveguide structure according to the second embodiment (FIG. 9B) are compared.

FIGS. 14A and 14B are diagrams showing a simulation result relating to an energy distribution on the light reception area of the light reception sensor portion 32. In FIGS. 14A and 14B, a case of the waveguide structure in related art (FIG. 14A) and a case of the waveguide structure according to the second embodiment (FIG. 14B) are compared.

FIGS. 14A and 14B show a case where one pixel is constituted of two G sub pixels, an R sub pixel, and a B sub pixel. Further, in FIGS. 14A and 14B, the light reception areas (area of the light reception sensor portion 32) 32G of the G sub pixels each are indicated by the solid line, the light reception area 32R of the R sub pixel is indicated by the broken line, and the light reception area 32B of the B sub pixel is indicated by the dash-dotted line. In addition, in this simulation result, an energy distribution of the green light that enters the light reception areas 32G of the two G sub pixels is shown as a representative of the sub pixels.

In the case of the waveguide structure of the related art example in which the area gravity center P of the light reception sensor portion 32 is shifted from the center Q of the micro lens 42 or the center O of the waveguide 40, as shown in FIG. 14A, light that enters the light reception areas 32G partly goes off (deviates from) the light reception area 32G. As a result, the loss of the light amount corresponding to the degree of the deviation is generated between the waveguide 40 and the light reception sensor portion 32, which degrades the sensitivity (parallel optical sensitivity) of the pixel.

In contrast, in the case where the waveguide structure according to the second embodiment, as apparent from FIG. 14B, it is possible to further prevent the incident light on the light reception area 32G from going off the light reception area 32G as compared to the case of the waveguide structure of the first embodiment. This is because, in particular, the layout in which the center O1 of the first waveguide 40A and the main light beam that passes the center of the micro lens 42 are coincided, and the area where the second waveguide 40B is overlapped with the light reception sensor portion 32 is increased is employed.

As described above, by using the pixel structure according to the second embodiment, the sensitivity can be further improved as compared to the pixel structure of the first embodiment. Thus, it is possible to respond to the further miniaturization of the pixel size. Specifically, even when the further miniaturization of the pixel size is advanced, and even when the area gravity center P of the light reception sensor portion 32 is deviated from the center Q of the micro lens 42, it is possible to minimize the sensitivity degradation due to the deviation, which can contribute to the further miniaturization of the pixel size.

4. Modification Example

In the above embodiments, as the solid-state image pickup apparatus to which the present invention is applied, the CMOS image sensor that employs the technique of the pupil correction is used. However, the application of the present invention is not limited to the CMOS image sensor that employs the technique of the pupil correction. That is, the technique of the first and second embodiments can also be applied to a CMOS image sensor that does not use the technique of the pupil correction.

In addition, in the above embodiments, the example of application to the CMOS image sensor is described. However, the application is not limited to the CMOS image sensor. Specifically, it is possible to apply the present invention to a general solid-state image pickup apparatus of an X-Y address type, in which unit pixels that detect a charge corresponding to the amount of visible light as a physical quantity and output it as an electrical signal are arranged in a matrix pattern. Further, the present invention can also be applied to a solid-state image pickup apparatus of a charge transfer type, which is typified by a CCD (charge coupled device) image sensor, in addition to the solid-state image pickup apparatus of the X-Y address type.

It should be noted that the solid-state image pickup apparatus may have a form of one chip, or may have a module-like form having the image-taking function, in which an image pickup portion and a signal processing portion or an optical system are collectively packaged.

5. Electronic Apparatus

The present invention can be applied not only to the solid-state image pickup apparatuses but also to an electronic apparatus such as an image pickup apparatus. In this case, the electronic apparatus refers to a mobile apparatus, e.g., an image pickup apparatus (camera system) such as a digital still camera and a video camera, a mobile phone having an image-taking function, or a PDA (personal digital assistant). It should be noted that the module-like form provided to the electronic apparatus, that is, a camera module may be used as the image pickup apparatus.

(Image Pickup Apparatus)

Figure 15:
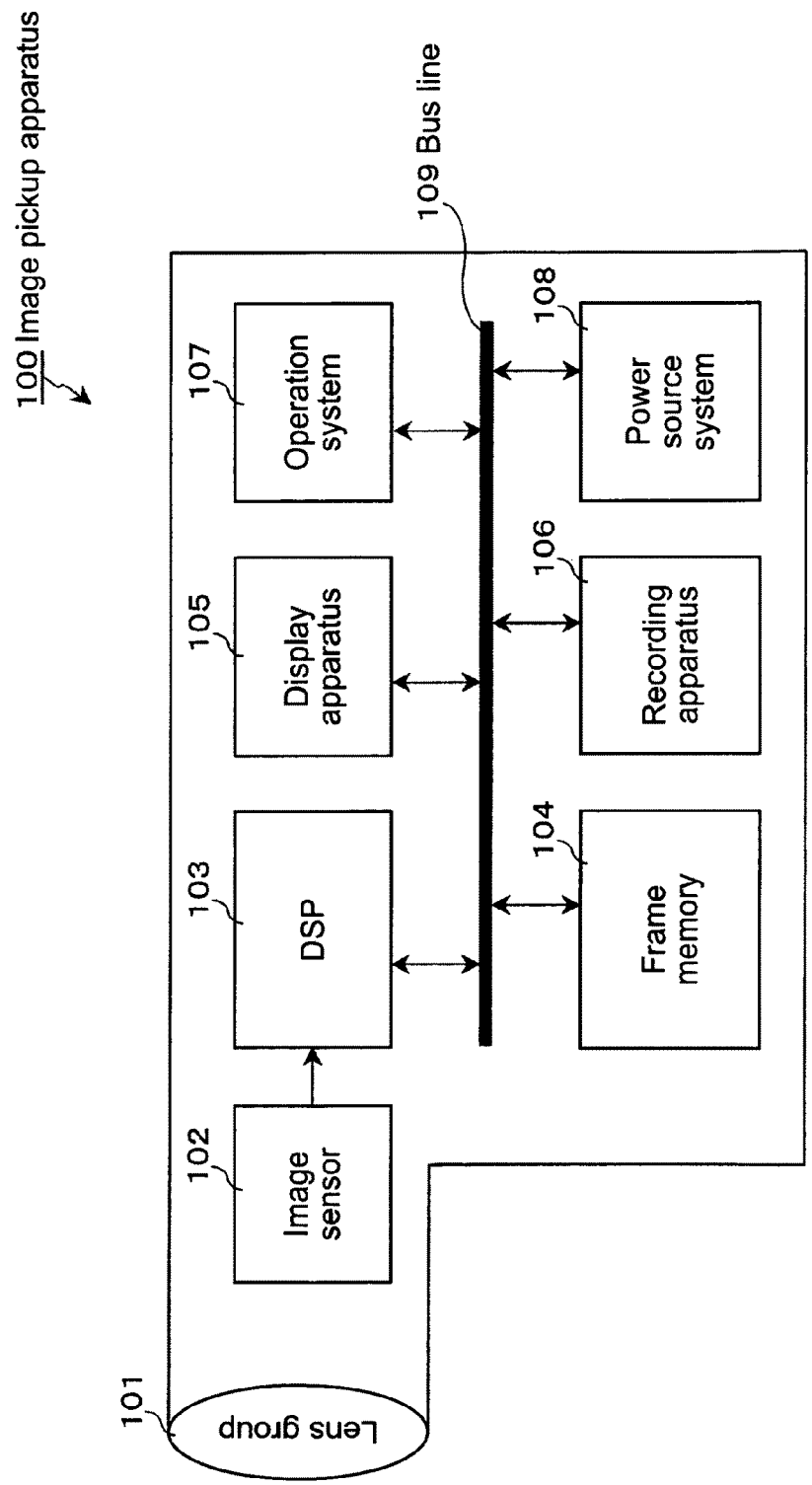
FIG. 15 is a block diagram showing a structural example of an image pickup apparatus as an example of an electronic apparatus according to the embodiments of the present invention.

FIG. 15 is a block diagram showing a structural example of an image pickup apparatus to which the present invention is applied. As shown in FIG. 15, an image pickup apparatus 100 includes an optical system having a lens group 101, an image sensor 102, a DSP circuit 103 serving as a camera signal processing portion, a frame memory 104, a display apparatus 105, a recording apparatus 106, an operation system 107, and a power source system 108. Among those components, the DSP circuit 103, the frame memory 104, the display apparatus 105, the recording apparatus 106, the operation system 107, and the power source system 108 are mutually connected through a bus line 109.

The lens group 101 collects incident light (image light) from a subject and forms an image on an imaging surface of the image sensor 102. The image sensor 102 converts the amount of the incident light that is imaged on the imaging surface by the lens group 101 into an electrical signal for each pixel, and outputs it as a pixel signal. As the image sensor 102, the CMOS image sensor in which the plurality of pixels each having the waveguide structure according to the first or second embodiment is used. The display apparatus 105 is formed of a panel-type display apparatus such as a liquid crystal display apparatus and an organic EL (electro-luminescence) display apparatus, and displays a moving image or a still image taken by the image sensor 102. The recording apparatus 106 records the moving image or the still image taken by the image sensor 102 on a recording medium such as a videotape and a DVD (digital versatile disk).

The operation system 107 gives operation commands for various functions of the image pickup apparatus under the control of a user who uses the image pickup apparatus. The power source system 108 appropriately supplies various power sources as operation sources to the DSP circuit 103, the frame memory 104, the display apparatus 105, the recording apparatus 106, and the operation system 107.

The image pickup apparatus 100 as described above is applied to a camera module for a mobile apparatus, such as a video camera, a digital still camera, and a mobile phone. By using the CMOS image sensor according to the first or second embodiment as the image sensor 102 of the image pickup apparatus 100, the sensitivity of the CMOS image sensor can be improved, thereby making it possible to respond to the miniaturization of the pixel size. As a result, taken images displayed with high definition along with the increase of the number of pixels can be provided.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup apparatus comprising:
   a plurality of pixels each including
      a lens,
      a photoelectric converter to convert incident light that passes through the lens into an electrical signal, and
      a waveguide provided between the lens and the photoelectric converter, the waveguide being disposed so that a center of at least a part of the waveguide on a light exit side is shifted from a main light beam that passes a center of the lens in a direction in which an area where an end portion of the waveguide on the light exit side is overlapped with the photoelectric converter is increased.

2. The solid-state image pickup apparatus according to claim 1,
   wherein the end portion of the waveguide on the light exit side has an area smaller than an area of the photoelectric converter.

3. The solid-state image pickup apparatus according to claim 2,
   wherein the end portion of the waveguide on the light exit side is in contact with a light reception surface of the photoelectric converter.

4. The solid-state image pickup apparatus according to claim 1,
   wherein the waveguide is constituted of a first waveguide and a second waveguide, the first waveguide being disposed on a side closer to the lens than the second waveguide, the second waveguide being disposed on a side closer to the photoelectric converter than the first waveguide,
   wherein the first waveguide is disposed so that a center of the first waveguide is coincided with the main light beam that passes the center of the lens, and
   wherein the second waveguide is disposed so that a center of the second waveguide is shifted from the main light beam that passes the center of the lens in a direction in which an area where the second waveguide is overlapped with the photoelectric converter is increased.

5. The solid-state image pickup apparatus according to claim 4, wherein the second waveguide is disposed so that the center of the second waveguide is coincided with a gravity center of an area of the photoelectric converter.

6. The solid-state image pickup apparatus according to claim 5,
wherein the second waveguide has an end portion on a light exit side whose area is smaller than the area of the photoelectric converter, and the end portion on the light exit side is in contact with a light reception surface of the photoelectric converter.

7. The solid-state image pickup apparatus according to claim 4,
wherein the first waveguide has an end portion on a light exit side, and the second waveguide has an end portion on a light incident side, the end portion of the first waveguide on the light exit side being in contact with the end portion of the second waveguide on the light incident side.

8. The solid-state image pickup apparatus according to claim 4,
wherein the first waveguide and the second waveguide are made of a single material.

9. The solid-state image pickup apparatus according to claim 4,
wherein the first waveguide and the second waveguide are made of materials whose refractive indexes are one of the same value and close values.

10. The solid-state image pickup apparatus according to claim 1, further comprising a multilayer wiring layer arranged between the lens and the photoelectric converter, in which the part of the waveguide is arranged within a hole of the multilayer wiring layer so that a center of the hole corresponds to the center of the part of the waveguide such that both the center of the hole and the center of the part of the waveguide are shifted from the center of the lens in the direction so as to be offset therefrom.

11. An electronic apparatus comprising:
a solid-state image pickup apparatus including
a plurality of pixels each including a lens, a photoelectric converter to convert incident light that passes through the lens into an electrical signal, and a waveguide provided between the lens and the photoelectric converter, the waveguide being disposed so that a center of at least a part on a light exit side is shifted from a main light beam that passes a center of the lens in a direction in which an area where an end portion of the waveguide on the light exit side is overlapped with the photoelectric converter is increased.

12. The electronic apparatus according to claim 11, further comprising a multilayer wiring layer arranged between the lens and the photoelectric converter, in which the part of the waveguide is arranged within a hole of the multilayer wiring layer so that a center of the hole corresponds to the center of the part of the waveguide such that both the center of the hole and the center of the part of the waveguide are shifted from the center of the lens in the direction so as to be offset therefrom.

* * * * *